United States Patent
Tu et al.

(10) Patent No.: US 7,768,432 B2
(45) Date of Patent: Aug. 3, 2010

(54) ANALOG-TO-DIGITAL CONVERSION DEVICES AND ANALOG-TO-DIGITAL CONVERSION STAGES THEREOF

(75) Inventors: Wei-Hsuan Tu, Hsinchu (TW); Tzung-Hung Kang, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/371,938

(22) Filed: Feb. 17, 2009

(65) Prior Publication Data

US 2009/0303092 A1    Dec. 10, 2009

Related U.S. Application Data

(60) Provisional application No. 61/058,953, filed on Jun. 5, 2008.

(51) Int. Cl.
   *H03M 1/06* (2006.01)
(52) U.S. Cl. .................................. 341/118; 341/155
(58) Field of Classification Search .......... 341/115–155
   See application file for complete search history.

(56) References Cited

U.S. PATENT DOCUMENTS

| | | | |
|---|---|---|---|
| 6,329,942 B1 * | 12/2001 | Nagaraj et al. | 341/158 |
| 7,212,140 B2 * | 5/2007 | Soderberg | 341/137 |
| 7,605,739 B2 * | 10/2009 | Sutardja | 341/159 |
| 2001/0052870 A1 * | 12/2001 | Nagaraj et al. | 341/159 |

\* cited by examiner

*Primary Examiner*—Lam T Mai
(74) *Attorney, Agent, or Firm*—Thomas, Kayden, Horstemeyer & Risley

(57) ABSTRACT

An analog-to-digital (A/D) conversion device is provided and includes a first A/D conversion stage. The A/D conversion stage includes a first pre-amp unit, first and second latch units, and a first conversion unit. The first pre-amp unit amplifies the analog input data and outputs a first amplified data. The first and second latch units are enabled by first and second latch clock signals to latch the first and second amplified data and generate first and second latched data, respectively. The first pre-amp unit is reset between a time point when the first latch unit is enabled and a time point when the second latch unit is enabled. The first conversion unit receives the analog input data, and the first and second latched data and accordingly generates a first analog output data.

23 Claims, 8 Drawing Sheets

ANALOG-TO-DIGITAL CONVERSION DEVICES AND ANALOG-TO-DIGITAL CONVERSION STAGES THEREOF

CROSS REFERENCE TO RELATED APPLICATIONS

The present application claims the benefit of U.S. provisional application entitled "SUBADC SHARING TECHNIQUE IN TIME-INTERLEAVED ADC", Ser. No. 61/058,953, filed Jun. 5, 2008.

BACKGROUND OF THE INVENTION

1. Field of the Invention

The invention relates to an analog-to-digital conversion device and stages thereof, and more particularly to a time-interleaved analog-to-digital conversion device and stages thereof.

2. Description of the Related Art

Driven by digital applications development, digital applications have become more and more popular, such as blue-ray discs. Signals transmitted to digital applications have to be digitized by a digital signal processing procedure. Thus, for communication between analog applications and digital applications, analog-to-digital conversion (ADC) devices are used to digitize input signals. Since digital signals are analyzed and processed more easily than analog signals, the ADC devices become more important for integrated circuits. For example, a PRML (Partial Response Maximum Likelihood) read channel for a blue-ray disc requires an 8-bit ADC device with minimal latency. Therefore, a high speed ADC device is a key component to improve speed of electronic devices, such as a blue-ray disc drive.

FIG. 1A shows a conventional pipeline ADC device. Referring to FIG. 1, a pipeline ADC device 1 comprises a sample-and-hold unit 11, a plurality of ADC stages $10_1$-$10_N$, and an error correction unit 12. The sample-and-hold unit 11 samples a received data D10 to generate an analog input data VIN1. Except for the last stage $10_N$, each ADC stage $10_i$ receives a respective analog input data $VIN_i$ and outputs a corresponding analog output VOUT$_i$ to serve as an analog input data $VIN_{i+1}$ of the next ADC stage, wherein 1□i<N. Each ADC stage also generates a digital data $DOUT_i$ to the error correction unit 12. Referring to FIG. 1B, each ADC stage comprises an ADC unit 100, a digital-to-analog conversion (DAC) unit 101, a subtracter 102, and an amplifier 103. Generally, the ADC unit 100 is a flash-type unit. Referring to FIG. 2, the flash-type ADC unit 100 comprises a sample-and-hold unit 20, a pre-amp unit 21, and a latch unit 22. However, kick-back noise easily occurs in the sample-and-hold unit 20. Moreover, if the pipeline ADC device 1 is desired in a time-interleaved structure, two sets of the sample-and-hold unit 20, the pre-amp unit 21, and the latch unit 22 are required for each ADC stage, resulting in larger area and higher power consumption requirements.

Thus, it is desired to provide an ADC device with a time-interleaved structure without the above drawbacks.

BRIEF SUMMARY OF THE INVENTION

An exemplary embodiment of an analog-to-digital conversion device is used to digitize analog input data and comprises a first analog-to-digital (A/D) conversion stage. The A/D conversion stage receives the analog input data and comprises a first pre-amp unit, a first latch unit, a second latch unit, and a first conversion unit. The first pre-amp unit amplifies the analog input data and outputs a first amplified data. The first latch unit is enabled by a first latch clock signal to latch the first amplified data and generate a first latched data. The second latch unit is enabled by a second latch clock signal to latch the first amplified data and generate a second latched data. The first pre-amp unit is reset between a time point when the first latch unit is enabled and a time point when the second latch unit is enabled. The first conversion unit receives the analog input data, the first latched data, and the second latched data and generates a first analog output data according to the analog input data, the first latched data, and the second latched data.

Another exemplary embodiment of an analog-to-digital conversion device is used to digitize an analog input data and comprises a first analog-to-digital (A/D) conversion stage. The first A/D conversion stage receives the analog input data and comprises a pre-amp unit, a first latch unit, a second latch unit, and a first conversion unit. The pre-amp unit amplifies the analog input data and outputs a first amplified data. The first latch unit is enabled at a first time point for latching the first amplified data to generate a first latched data. The second latch unit is enabled at a second time point for latching the first amplified data to generate a second latched data. The pre-amp unit is reset between the first and second time points. The first conversion unit receives the analog input data, the first latched data, and the second latched data and generates first analog output data according to the analog input data, the first latched data, and the second latched data.

An exemplary embodiment of an analog-to-digital (A/D) conversion stage comprises a pre-amp unit, a first latch unit and a second latch unit. The pre-amp unit for amplifying analog input data and outputting an amplified datafirst latch unit enabled by a first latch clock signal to latch the amplified data and generate a first latched datasecond latch unit enabled by a second latch clock signal to latch the amplified data and generate a second latched datahe pre-amp unit is reset between a time point when the first latch unit is enabled and a time point when the second latch unit is enabled.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
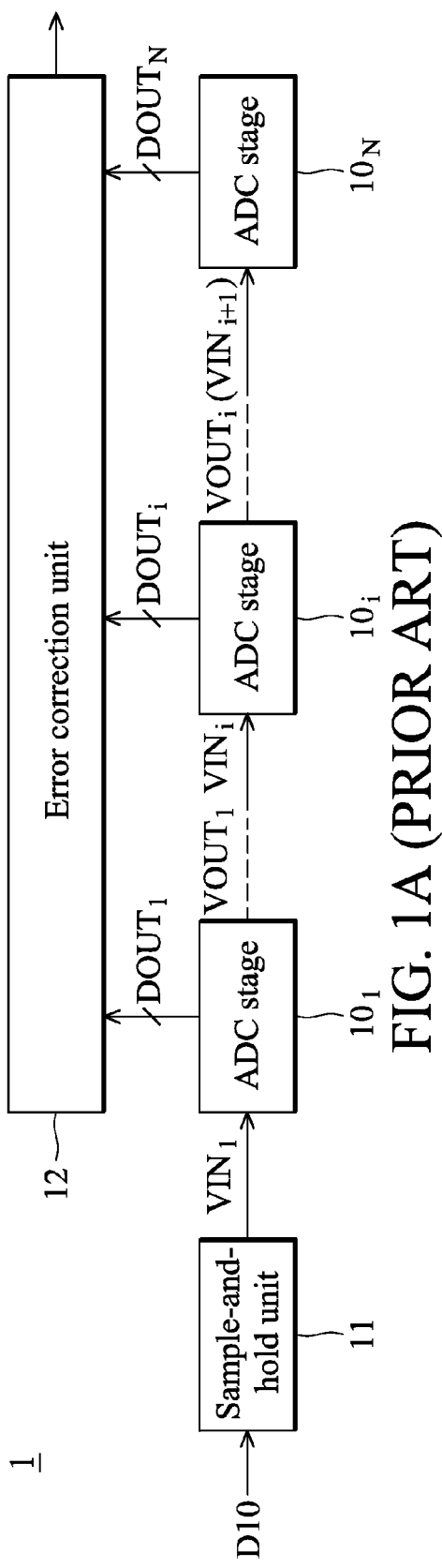
FIG. 1A shows a conventional pipeline ADC device.
Figure 1B:
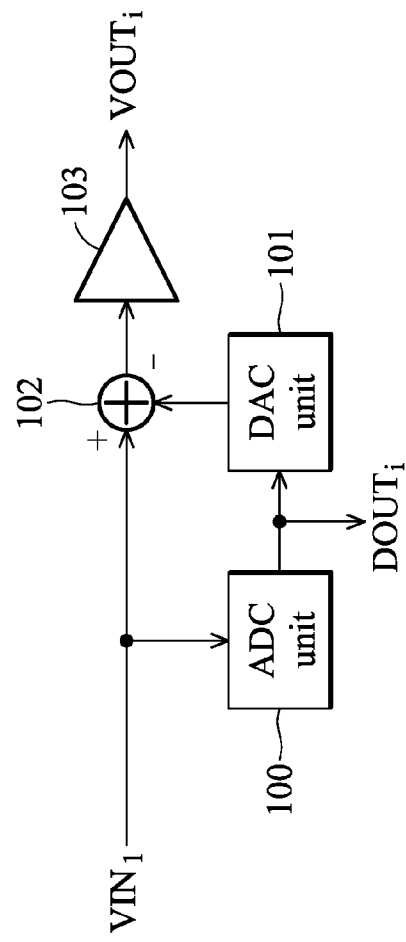
FIG. 1B shows each ADC stage of a conventional pipeline ADC device.
Figure 2:
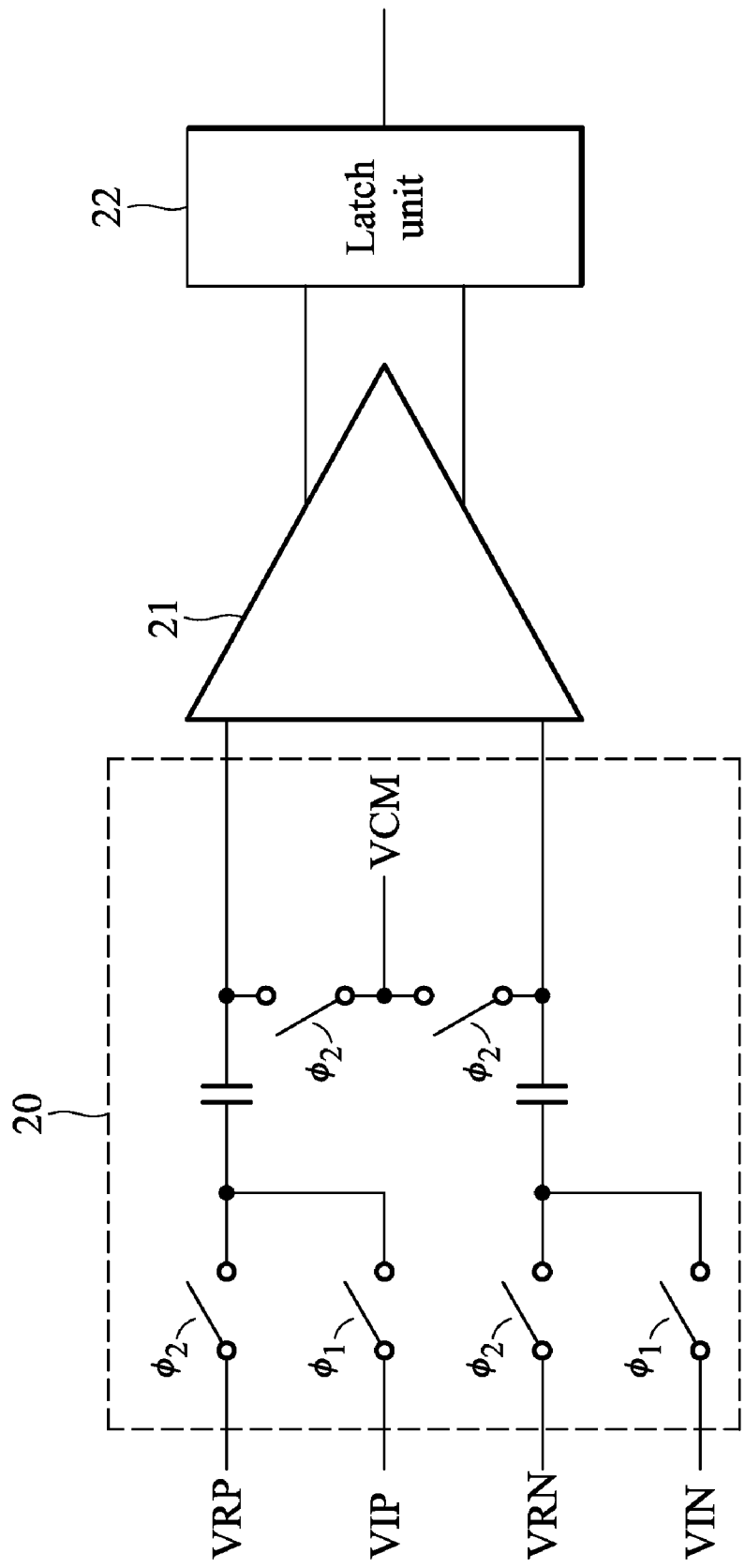
FIG. 2 shows a flash-type ADC unit performing each ADC stage of a conventional pipeline ADC device.
Figure 3:
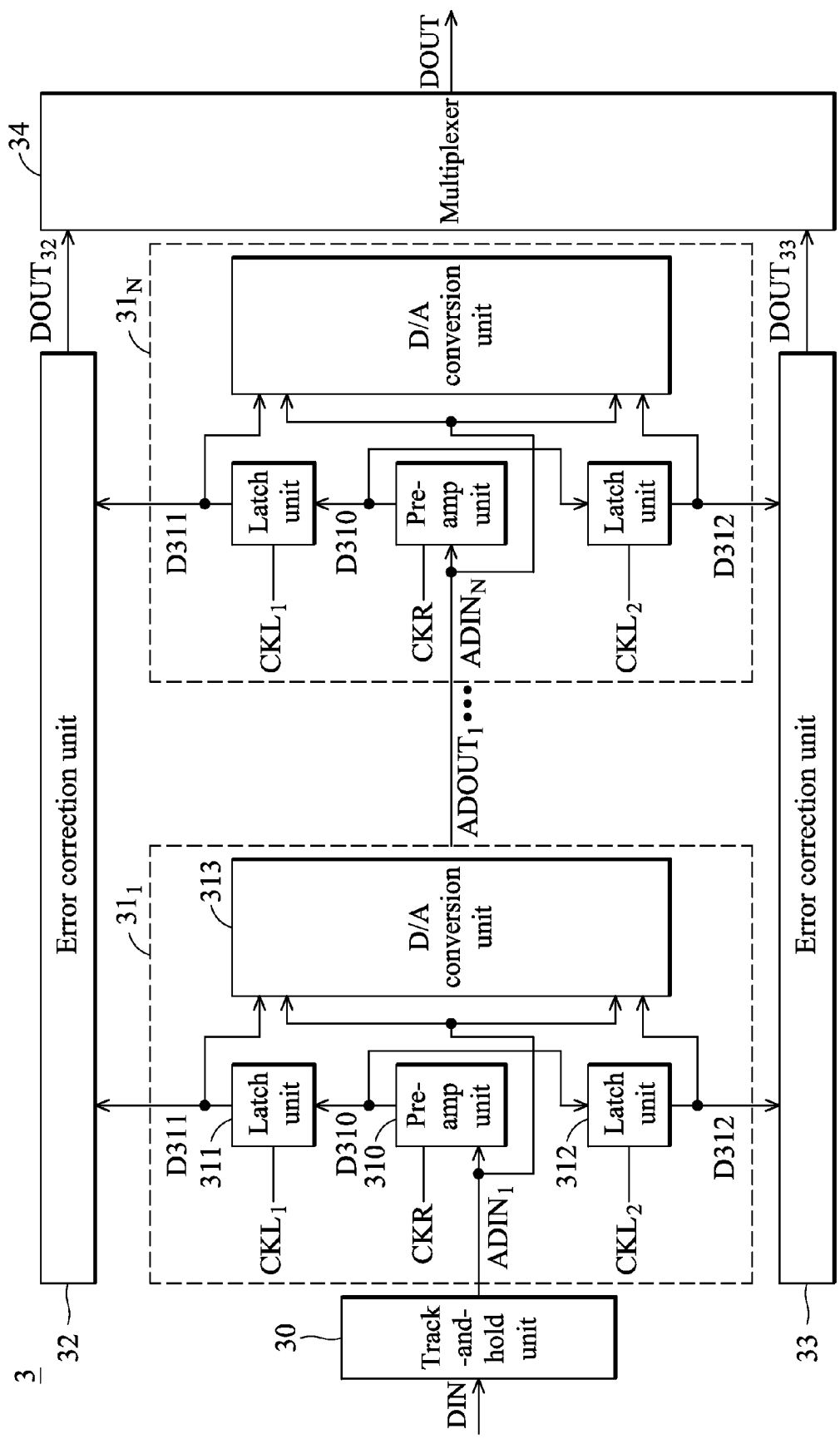
FIG. 3 shows an exemplary embodiment of an analog-to-digital (A/D) conversion device.

Analog-to-digital conversion devices are provided. In an exemplary embodiment of an analog-to-digital (A/D) conversion device in FIG. 3, an A/D conversion device 3 comprises a track-and-hold unit 30, a plurality of A/D conversion stages $31_1$-$31_N$, error correction units 32 and 33, and a multiplexer 34, wherein N is positive integer. The track-and-hold unit 30 receives and samples a received data DIN to generate an analog input data $ADIN_1$. The first A/D conversion stage $31_1$ among the plurality of A/D conversion stages $31_1$-$31_N$ receives the analog input data $ADIN_1$ and outputs analog output data $ADOUT_1$ to the next A/D conversion stage to serve as its analog input data. Referring to FIG. 3, except for the first and last A/D conversion stage $31_1$ and $31_N$, each of A/D conversion stages receives the analog output data of the previous A/D conversion stage to serve as the respective analog input data and outputs the respective analog output data to the next A/D conversion stage.

In the following, the A/D conversion stage $31_1$ is given as an example for detailed description, and the other A/D conversion stages may have the same structure and perform the same operations as the first A/D conversion stage $31_1$. As shown in FIG. 3, the A/D conversion stage $31_1$ comprises a pre-amp unit 310, latch units 311 and 312, and a conversion unit 313. The pre-amp unit 310 is controlled by a reset clock signal CKR. The pre-amp unit 310 amplifies the analog input data $ADIN_1$ and outputs an amplified data D310. The latch unit 311 is enabled by a latch clock signal $CKL_1$ to latch the amplified data D310 and generate a latched data D311. The latch unit 312 is enabled by a latch clock signal $CKL_2$ to latch the amplified data D310 and generate a latched data D312.

Figure 4:
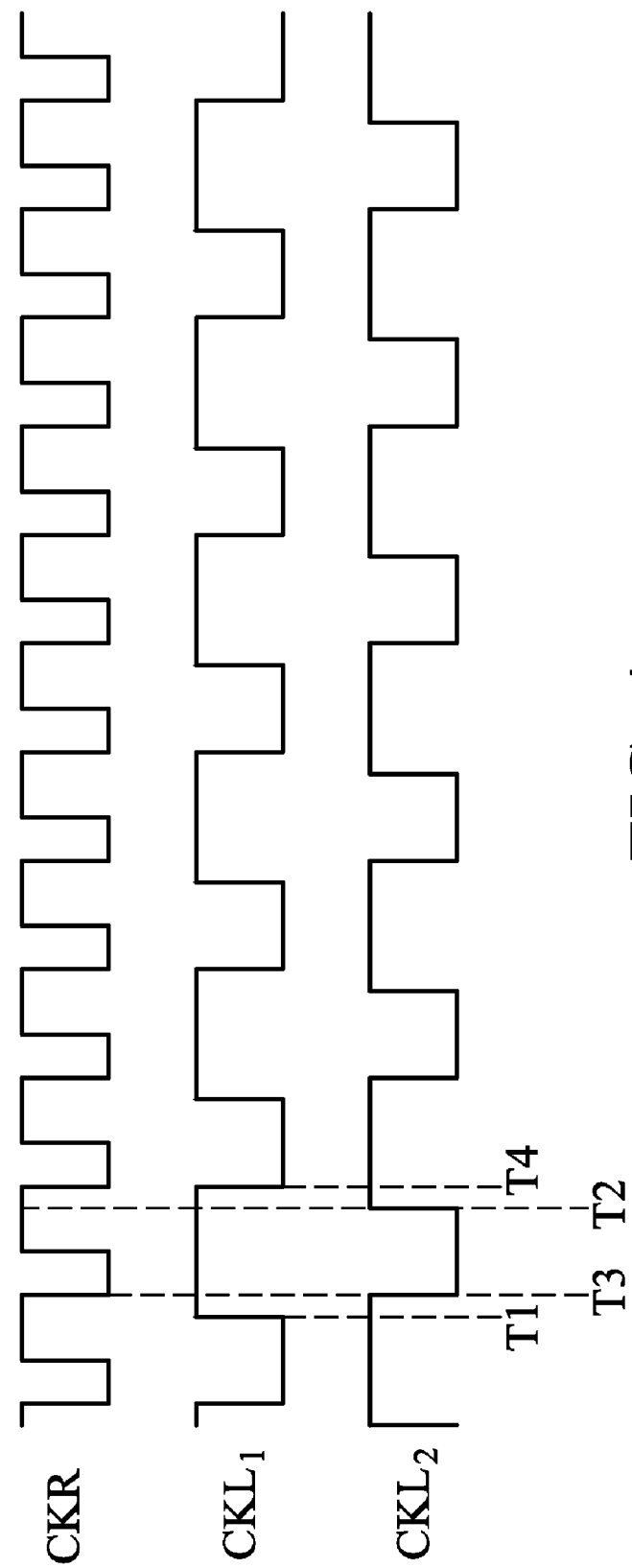
FIG. 4 shows an exemplary embodiment of the timing of the latch clock signals and the reset clock in FIG. 3.

Referring to FIG. 4, the period when the latch clock signal $CKL_1$ is at a low level may not overlap with the period when the latch clock signal $CKL_2$ is at the low level. In other words, the latch clock signals $CKL_1$ and $CKL_2$ may not be simultaneously at the low level. The latch units 311 and 312 may be respectively enabled by rising edges of the latch clock signals $CKL_1$ and $CKL_2$. Thus, the first and second latch units 311 and 312 may be respectively enabled at different time points. For example, the latch unit 311 is enabled by the latch clock signal $CKL_1$ at a time point T1, and the latch unit 312 is enabled by the latch clock signal $CKL_2$ at a time point T2 later than the time point T1. In this embodiment, the pre-amp unit 310 is reset by the falling edge of the reset clock signal CKR. Referring to FIG. 4, before each of the latch units 311 and 312 is enabled, the pre-amp unit 310 is reset by the falling edge of the reset clock signal CKR. For example, before the latch unit 312 is enable by the latch clock signal $CKL_2$ at the time point T2, the pre-amp unit 310 is reset by the reset clock signal CKR at a time T3 between the time points T1 and T2. In some embodiments, depending on different requirements, the latch units 311 and 312 may be disabled and the pre-amp unit 310 may be reset at the same time point. For example, the latch unit 312 may be disabled and the pre-amp unit 310 may be reset at the time point T3, and the latch unit 311 may be disabled and the pre-amp unit 310 may be reset at the time point T4.

As shown in FIG. 3, the conversion unit 313 of the A/D conversion stage $31_1$ receives the analog input data $ADIN_1$, the latched data D311, and the latched data D312 and generates the analog output data $ADOUT_1$ according to the analog input data $ADIN_1$, the latched data D311, and the latched data D312. The analog output data $ADOUT_1$ serves as an analog input data of the next A/D conversion stage.

Moreover, the latch unit 311 also provides the latched data D311 to the error correction unit 32, and the latch unit 312 also provides the latched data D312 to the error correction unit 33. Thus, the error correction unit 32 corrects the latched data D311 from each of the A/D conversion stages $31_1$-$31_N$ and outputs a digital output data DOUT32. The error correction unit 33 corrects the latched data D312 from each of the A/D conversion stages $31_1$-$31_N$ and outputs a digital output data DOUT33. The multiplexer 34 receives the digital output data Dout32 and the digital output data Dout33 and selectively outputs the digital output data Dout32 and Dout33.

In some embodiments, the error correction unit 32 may first convert the latched data D311 from a thermometer code to a binary code and then correct the latched data D311 with the binary code. Similarly, the error correction unit 33 may first convert the latched data D312 from a thermometer code to a binary code and then correct the latched data D312 with the binary code.

In some embodiments, the A/D conversion device 3 comprises a track-and-hold unit 30, a single A/D conversion stage $31_1$, error correction units 32 and 33, and a multiplexer 34. The conversion unit 313 of the A/D conversion stage $31_1$ provides the analog output signal $ADOUT_1$ to serve as its analog input data $ADIN_1$.

According to FIG. 3, the A/D conversion device 3 may be pipeline type and operates by a time-interleaved structure. Performing each A/D conversion stage, two latch units share one pre-amp unit, and the pre-amp unit can be reset between the time points when each of the two latch units is enabled. Thus, any one of the two latch units is not affected by the other one. The present invention applies to cyclic type A/D conversion devices as well. The shared pre-amp unit of the A/D conversion stage brings the cyclic type A/D conversion devices smaller area and lower power consumption.

Figure 5:
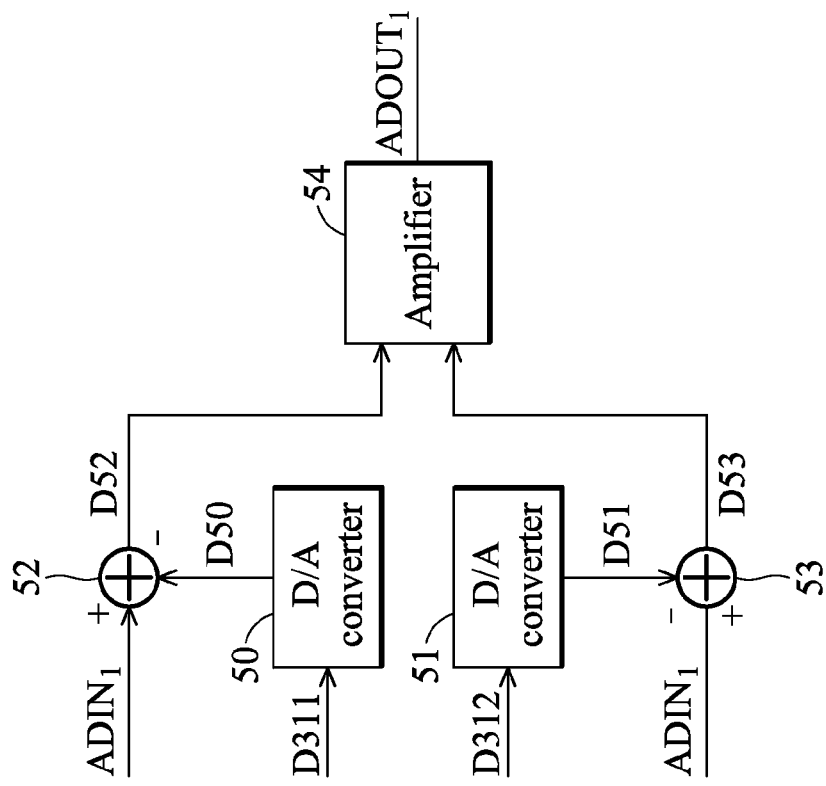
FIG. 5 shows an exemplary embodiment of the conversion unit in each A/D conversion stage.

FIG. 5 shows an exemplary embodiment of the conversion unit 313 in each A/D conversion stage. Referring to FIG. 5, the conversion unit 313 comprises D/A converters 50 and 51, subtracters 52 and 53, and an amplifier 54. The D/A converter 50 receives the latched data D311 and converts the latched data D311 to an analog conversion data D50. The subtracter 52 subtracts the analog conversion data D50 from the analog input data $ADIN_1$ to generate a subtracted data D52. The D/A converter D51 receives the latched data D312 and converts the latched data D312 to an analog conversion data D51. The subtracter 53 subtracts the analog conversion data D51 from the analog input data $ADIN_1$ to generate a subtracted data D53. The amplifier 53 alternately amplifies the subtracted data D52 and the subtracted data D53, and the amplified subtracted data serves as the analog output data $ADOUT_1$.

Figure 6:
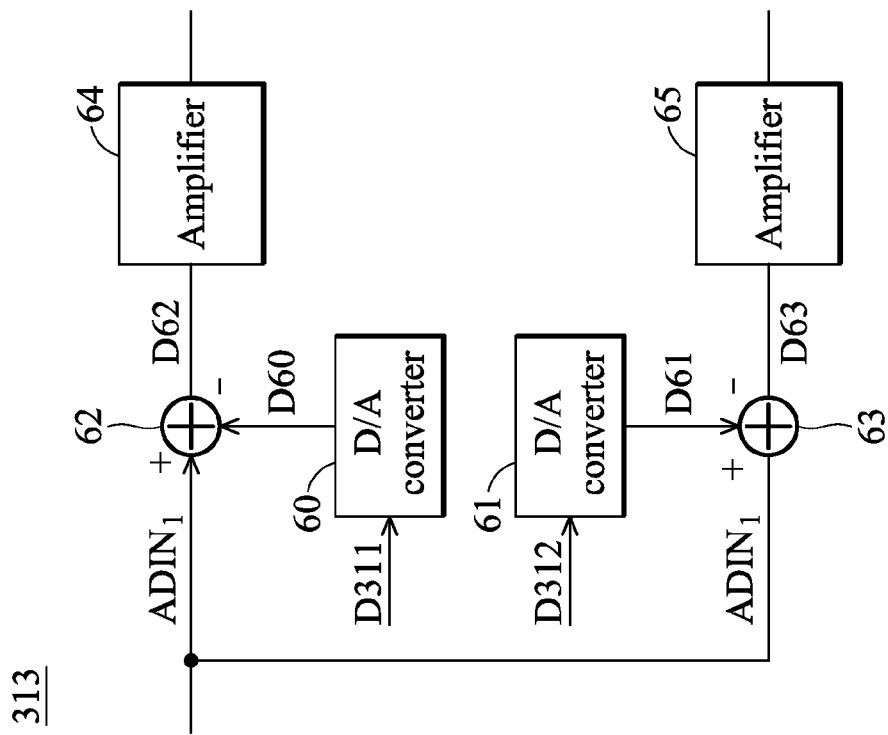
FIG. 6 shows another exemplary embodiment of the conversion unit in each A/D conversion stage.

FIG. 6 shows another exemplary embodiment of the conversion unit 313 in each A/D conversion stage. Referring to FIG. 6, the conversion unit 313 comprises D/A converters 60 and 61, subtracters 62 and 63, and amplifiers 64 and 65. The D/A converter 60 receives the latched data D311 and converts the latched data D311 to an analog conversion data D60. The subtracter 62 subtracts the analog conversion data D60 from the analog input data $ADIN_1$ to generate a subtracted data D62. The amplifier 64 amplifies the subtracted data D62. The D/A converter D61 receives the latched data D312 and converts the latched data D312 to an analog conversion data D61.

The subtracter 63 subtracts the analog conversion data D61 from the analog input data $ADIN_1$ to generate a subtracted data D63. The amplifier 65 amplifies the subtracted data D63. In this embodiment, the amplifiers 64 and 65 alternately output the amplified subtracted data D62 and the amplified subtracted data D63 to serve as the analog output data $ADout_1$. A switch can be used to switch the amplified subtracted data D62 and the amplified subtracted data D63 to serve as the analog output data $ADOUT_1$.

Figure 7:
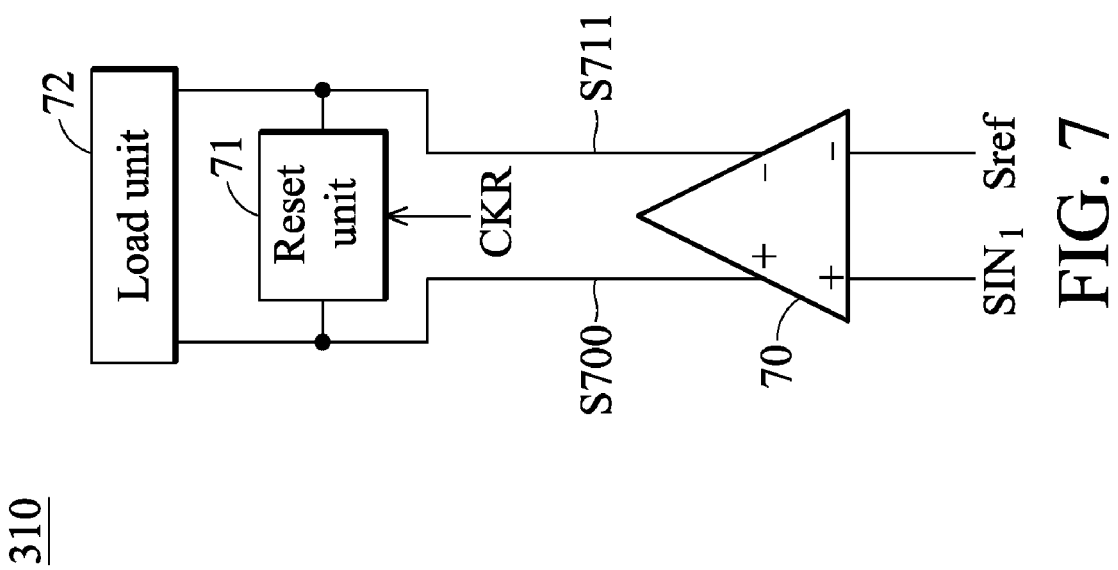
FIG. 7 shows an exemplary embodiment of the pre-amp unit in each A/D conversion stage.

In some embodiments, the analog input data $ADIN_1$ comprises a single analog input signal. FIG. 7 shows an exemplary embodiment of the pre-amp unit 310 of an A/D conversion stage when the analog input data $ADIN_1$ comprises a single analog input signal. Referring to FIG. 7, the pre-amp unit 310 comprises a comparator 70, a reset unit 71, and a load unit 72. The comparator 70 receives an analog input signal $SIN_1$ of the analog input data $ADIN_1$ and a reference signal Sref and generates amplified signals S700 and S711 according to the difference between the analog input signal $SIN_1$ and the reference signal Sref, wherein the amplified signals S700 and S711 serves as the amplified data D310. The reset unit 71 is coupled to the comparator 70. The load unit 72 is coupled to the comparator 70 and the reset unit 71. In this embodiment, between the time point when the latch unit 311 is enabled and the time point when the latch unit 312 is enabled, the reset unit 71 is enabled to reset levels of the amplified signals S700 and S701.

In some embodiments, the analog input data $ADIN_1$ comprises differential analog input signals. FIG. 8A shows an exemplary embodiment of the pre-amp unit 310 of an A/D conversion stage when the analog input data $ADIN_1$ comprises differential analog input signals SPIN and SNIN. Referring to FIG. 8, the pre-amp unit 310 comprises comparators 80 and 81, a reset unit 82, and a load unit 83. The comparator 80 receives the analog input signal SPIN and a reference signal SPref and generates an amplified signal S80a and an amplified signal S80b according to the analog input signal SPIN and the reference signal SPref. The comparator 81 receives the analog input signal SNIN and a reference signal SNref and generates an amplified signal S81a and an amplified signal S81b according to the analog input signal SNIN and the reference signal SNref. An amplified signal S800 is generated according to the difference between the amplified signals S80a and S81b, and an amplified signal S801 is generated according to the difference between the amplified signals S80b and S81a. The amplified signals S800 and S801 serve as the amplified data D310. The reset unit 82 is coupled to the comparators 80 and 81. The load unit 83 is coupled to the comparators 80 and 81 and the reset unit 82. In the embodiment, between the time point when the latch unit 311 is enabled and the time point when the latch unit 312 is enabled, the reset unit 82 is enabled to reset levels of the amplified signals S800 and S801.

Figure 8B:
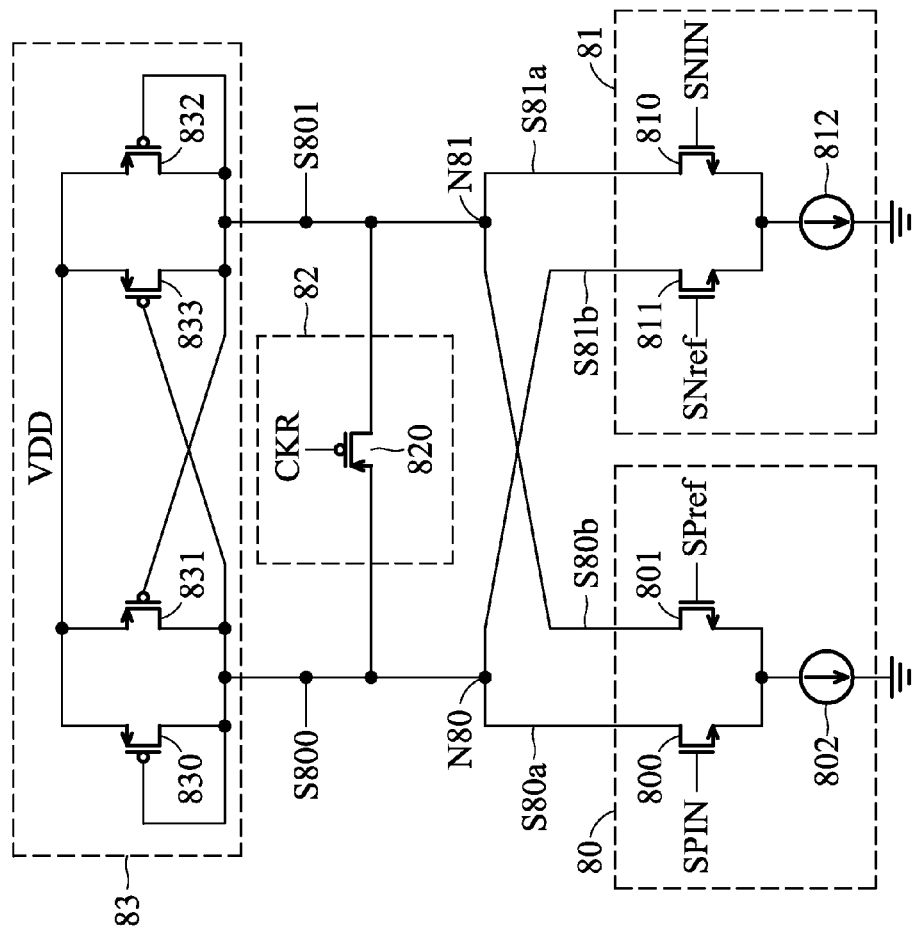
FIG. 8B shows another exemplary embodiment of the pre-amp unit in each A/D conversion stage.
Figure 8A:
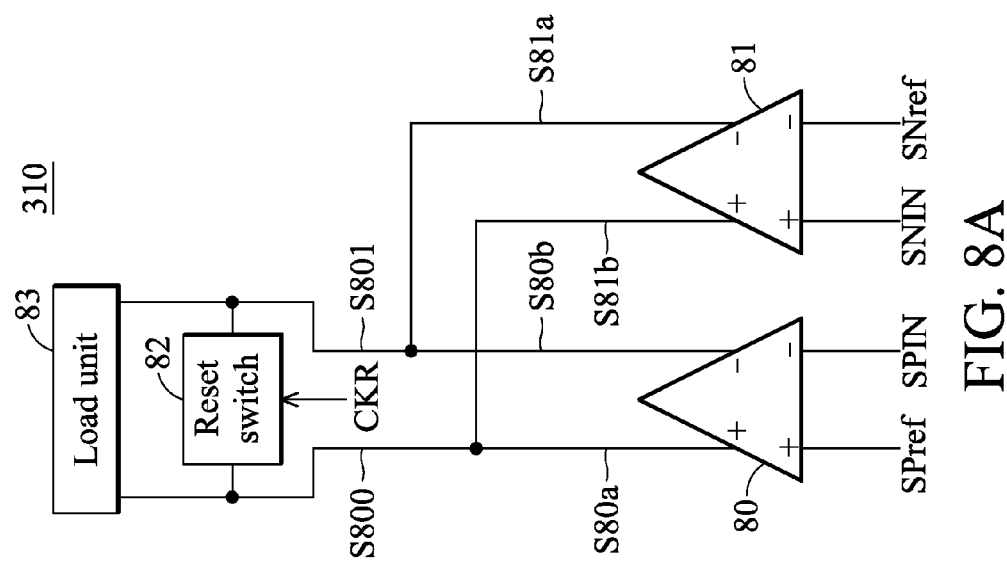
FIG. 8A shows another exemplary embodiment of the pre-amp unit in each A/D conversion stage.

FIG. 8B shows the detailed circuitry of the comparators 80 and 81, the reset unit 82, and the load unit 83 in FIG. 8A. The comparator 80 comprises N-type metal oxide semiconductor (NMOS) transistors 800 and 801 and a current source 802. The comparator 81 comprises NMOS transistors 810 and 811 and a current source 812. The reset unit 82 comprises a PMOS transistor 820. The load unit 83 comprises PMOS transistors 830-833. The NMOS transistor 800 has a gate receiving the analog input signal SPIN, a drain coupled to a node N80 and generating the amplified signal S80a, and a source. The NMOS transistor 801 has a gate receiving the reference signal SPref, a drain coupled to a node N81 and generating the amplified signal S80b, and a source coupled to the source of the NMOS transistor 800. The current source 802 is coupled between the source of the NMOS transistor 801 and a ground terminal GND. The NMOS transistor 810 has a gate receiving the analog input signal SNIN, a drain coupled to the node N81 and generating the amplified signal S81a, and a source. The NMOS transistor 811 has a gate receiving the reference signal SNref, a drain coupled to the node N80 and generating the amplified signal S81b, and a source coupled to the source of the NMOS transistor 810. The current source 812 is coupled between the source of the NMOS transistor 810 and the ground terminal GND.

In the load unit 83, the PMOS transistor 830 has a gate coupled to the node N80, a source coupled to a voltage source VDD, and a drain coupled to the node N80. The PMOS transistor 831 has a gate coupled to the node N81, a source coupled to the voltage source VDD, and a drain coupled to the node N80. The PMOS transistor 832 has a gate coupled to the node N81, a source coupled to the voltage source VDD, and a drain coupled to the node N81. The PMOS transistor 833 has a gate coupled to the node N80, a source coupled to the voltage source VDD, and a drain coupled to the node N81. In the reset unit 82, the PMOS transistor 820 has a gate receiving the reset clock signal CKR, a source coupled to the node N80, and a drain coupled to the node N81. The amplified signal S800 is generated at the node N80 according to the difference between the amplified signals S80a and S81b, and the amplified signal S801 is generated at the node N81 according to the difference between the amplified signals S80b and S81a. In this embodiment, between the time point when the latch unit 311 is enabled and the time point when the latch unit 312 is enabled, the PMOS transistor 820 is turned on by the reset clock signal CKR to reset the levels of the amplified signals S800 and S801.

Figure 9:
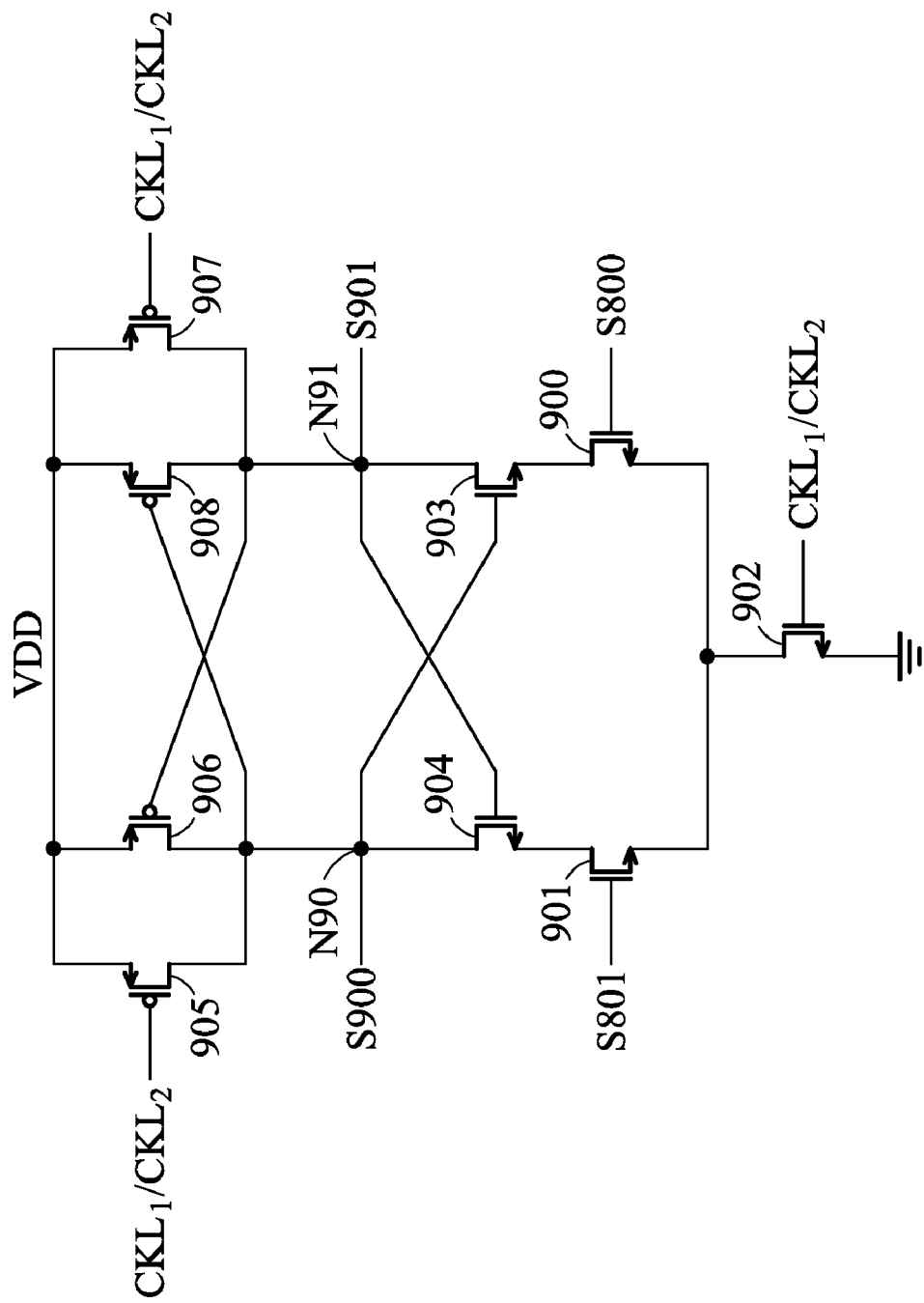
FIG. 9 shows an exemplary embodiment of the latch unit in each A/D conversion stage.

Based on the circuitry of the pre-amp unit 310 of the A/D conversion stage in FIG. 8B, each latch unit can be implemented by the circuit as shown in FIG. 9. Referring to FIG. 9, each latch unit comprises NMOS transistors 900-904 and PMOS transistors 905-908. The NMOS transistor 900 has a gate receiving the amplified signal S800, a drain, and a source. The NMOS transistor 901 has a gate receiving the amplified signal S801, a drain, and a source coupled to the source of the NMOS transistor 900. The NMOS transistor 902 has a gate, a drain coupled to the source of the NMOS transistor 900, and a source coupled to the ground terminal GND. The NMOS transistor 903 has a gate coupled to a node N90, a drain coupled to a node N91, and a source coupled to the drain of the NMOS transistor 900. The NMOS transistor 904 has a gate coupled to the node N91, a drain coupled to the N90 node, and a source coupled to the drain of the NMOS transistor 901. The PMOS transistor 905 has a gate, a source coupled to the voltage source VDD, and a drain coupled to the node N90. The PMOS transistor 906 has a gate coupled to the node N91, a source coupled to the voltage source VDD, and a drain coupled to the node N90. The PMOS transistor 907 has a gate, a source coupled to the voltage source VDD, and a drain coupled to the node N91. The PMOS transistor 908 has a gate coupled to the node N90, a source coupled to the voltage source VDD, and a drain coupled to the node N91. For the latch unit 311, the gates of the NMOS transistor 902 and the PMOS transistors 905 and 907 receive the latch clock signal $CKL_1$. Meanwhile, in the latch unit 312, the gates of the NMOS transistor 902 and the PMOS transistors 905 and 907 receive the latch clock signal $CLK_2$. Referring to FIG. 9, a latched signal S900 is generated at the node N90, and a latched signal S901 is generated at the node N91. Thus, the latched signals S900 and S901 in the latch unit 311 constitute the latched data D311, while the latched signals S900 and S901 in the latch unit 312 constitute the latched data D312.

According to the circuitry of the latch unit, the latch unit is used to amplify the different levels between the amplified signals S800 and S801, so that the level of one of the amplified signals S800 and S801 is pulled high to the level of the voltage source VDD, and the level of the other one is pulled low to the level of the ground terminal GND. In other words, the latched signals S900 and S901 are generated according to the amplified signals S800 and S801, and the different levels between the latched signals S900 and S901 greater than the different levels between the amplified signals S800 and S801.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital conversion device for digitizing an analog input data, comprising:
    a first analog-to-digital (A/D) conversion stage for receiving the analog input data, wherein the first A/D conversion stage comprises:
        a first pre-amp unit for amplifying the analog input data and outputting a first amplified data;
        a first latch unit enabled by a first latch clock signal to latch the first amplified data and generate a first latched data;
        a second latch unit enabled by a second latch clock signal to latch the first amplified data and generate a second latched data, wherein the first pre-amp unit is reset between a time point when the first latch unit is enabled and a time point when the second latch unit is enabled; and
        a first conversion unit for receiving the analog input data, the first latched data, and the second latched data and generating a first analog output data according to the analog input data, the first latched data, and the second latched data.

2. The analog-to-digital conversion device as claimed in claim 1 further comprising:
    a first error correction unit for receiving and correcting the first latched data and outputting a first digital output data; and
    a second error correction unit for receiving and correcting the second latched data and outputting a second digital output data.

3. The analog-to-digital conversion device as claimed in claim 1, wherein the first conversion unit comprises:
    a first D/A converter for receiving the first latched data and converting the first latched data to a first analog conversion data;
    a first subtracter for subtracting the first analog conversion data from the analog input data to generate a first subtracted data;
    a second D/A converter for receiving the second latched data and converting the second latched data to a second analog conversion data;
    a second subtracter for subtracting the second analog conversion data from the analog input data to generate a second subtracted data; and
    an amplifier for alternately amplifying the first subtracted data and the second subtracted data to serve as the first analog output data.

4. The analog-to-digital conversion device as claimed in claim 1, wherein the first conversion unit comprises:
    a first D/A converter for receiving the first latched data and converting the first latched data to a first analog conversion data;
    a first subtracter for subtracting the first analog conversion data from the analog input data to generate a first subtracted data;
    a first amplifier for amplifying the first subtracted data;
    a second D/A converter for receiving the second latched data and converting the second latched data to a second analog conversion data;
    a second subtracter for subtracting the second analog conversion data from the analog input data to generate a second subtracted data; and
    a second amplifier for amplifying the second subtracted data;
    wherein the first and second amplifiers alternately output the first subtracted data and the second subtracted data, which are respectively amplified by the first and second amplifiers, to serve as the first analog output data.

5. The analog-to-digital conversion device as claimed in claim 1, wherein the first conversion unit provides the first analog output data to the first A/D conversion stage to serve as the analog input data.

6. The analog-to-digital conversion device as claimed in claim 1 further comprising a second A/D conversion stage for receiving the first analog output data from the first A/D conversion stage.

7. The analog-to-digital conversion device as claimed in claim 6, wherein the second A/D conversion stage comprises:
    a second pre-amp unit for amplifying the first analog output data and outputting a second amplified data;
    a third latch unit enabled by the first latch clock signal to latch the second amplified data and generate a third latched data;
    a fourth latch unit enabled by the second latch clock signal to latch the second amplified data and generate a fourth latched data, wherein before each of the third and fourth latch units is enabled, the second pre-amp unit is reset; and
    a second conversion unit for receiving the first analog output data, the third latched data, and the fourth latched data and generating a second analog output data according to the first analog output data, the third latched data, and the fourth latched data.

8. The analog-to-digital conversion device as claimed in claim 1, wherein the analog input data comprises an analog input signal, and the first pre-amp unit comprises:
    a comparator for receiving the analog input signal and a reference signal and generating a first amplified signal and a second amplified signal by comparing the analog input signal and the reference signal, wherein the first and second amplified signals serve as the first amplified data;
    a reset unit coupled to the comparator; and
    a load unit coupled to the comparator and the reset unit;
    wherein the reset unit is enabled to reset levels of the first and second amplified signals between the time point when the first latch unit is enabled and the time point when the second latch unit is enabled.

9. The analog-to-digital conversion device as claimed in claim 8, wherein the first latch unit is enabled by the first latch clock signal to pull the first and second amplified signals to a predetermined high level or a predetermined low level to generate the first latched data, and the second latch unit is enabled by the second latch clock signal to pull the first and second amplified signals to the predetermined high level or the predetermined low level to generate the second latched data.

10. The analog-to-digital conversion device as claimed in claim 1, wherein the analog input data comprises differential first and second analog input signals, and the first pre-amp unit comprises:
a first comparator for receiving the first analog input signal and a first reference signal and generating a first amplified signal and a second amplified signal according to the first analog input signal and the first reference signal;
a second comparator for receiving the second analog input signal and a second reference signal and generating a third amplified signal and a fourth amplified signal according to the second analog input signal and the second reference signal, wherein a fifth amplified signal is generated according to a difference between the first and fourth amplified signals, a sixth amplified signal is generated according to a difference between the second and third amplified signals, and the fifth and sixth amplified signals serve as the first amplified data;
a reset unit coupled to the first comparator and the second comparator; and
a load unit coupled to the first and second comparators and the reset unit;
wherein the reset unit is enabled to reset levels of the fifth and sixth amplified signals between the time point when the first latch unit is enabled and the time point when the second latch unit is enabled.

11. The analog-to-digital conversion device as claimed in claim 10, wherein the first latch unit is enabled by the first latch clock signal to pull each of the fifth and sixth amplified signals to a predetermined high level or a predetermined low level to generate the first latched data, and the second latch unit is enabled by the second latch clock signal to pull each of the fifth and sixth amplified signals to the predetermined high level or the predetermined low level to generate the second latched data.

12. The analog-to-digital conversion device as claimed in claim 1, wherein the analog input data comprises differential first and second analog input signals, and the first pre-amp unit comprises:
a first N-type metal oxide semiconductor (NMOS) transistor having a gate receiving the first analog input signal, a drain coupled to a first node, and a source;
a second NMOS transistor having a gate receiving a first reference signal, a drain coupled to a second node, and a source coupled to the source of the first NMOS transistor;
a first current source coupled between the source of the first NMOS transistor and a ground terminal;
a third NMOS transistor having a gate receiving the second analog input signal, a drain coupled to the second node, and a source;
a fourth NMOS transistor having a gate receiving a second reference signal, a drain coupled to the first node, and a source coupled to the source of the third NMOS transistor;
a second current source coupled between the source of the third NMOS transistor and the ground terminal;
a first PMOS transistor having a gate coupled to the first node, a source coupled to a voltage source, and a drain coupled to the first node;
a second PMOS transistor having a gate coupled to the second node, a source coupled to the voltage source, and a drain coupled to the first node;
a third PMOS transistor having a gate coupled to the second node, a source coupled to the voltage source, and a drain coupled to the second node;
a fourth PMOS transistor having a gate coupled to the first node, a source coupled to the voltage source, and a drain coupled to the second node; and
a fifth PMOS transistor having a gate receiving a reset clock signal, a source coupled to the first node, and a drain coupled to the second node;
wherein a first amplified signal is generated at the first node, and a second amplified signal is generated at the second node; and
wherein the first and second amplified signals constitute the first amplified data.

13. The analog-to-digital conversion device as claimed in claim 12, wherein the fifth PMOS transistor is turned on by the reset clock signal to reset levels of the first and second amplified signals between the time point when the first latch unit is enabled and the time point when the second latch unit is enabled.

14. The analog-to-digital conversion device as claimed in claim 12, wherein each of the first and second latch units comprises:
a fifth NMOS transistor having a gate receiving the first amplified signal, a drain, and a source;
a sixth NMOS transistor having a gate receiving the second amplified signal, a drain, and a source coupled to the source of the fifth NMOS transistor;
a seventh NMOS transistor having a gate, a drain coupled to the source of the fifth NMOS transistor, and a source coupled to the ground terminal;
an eighth NMOS transistor having a gate coupled to a third node, a drain coupled to a fourth node, and a source coupled to the drain of the fifth NMOS transistor;
a ninth NMOS transistor having a gate coupled to the fourth node, a drain coupled to the third node, and a source coupled to the drain of the sixth NMOS transistor;
a sixth PMOS transistor having a gate, a source coupled to the voltage source, and a drain coupled to the third node;
a seventh PMOS transistor having a gate coupled to the fourth node, a source coupled to the voltage source, and a drain coupled to the third node;
an eighth PMOS transistor having a gate, a source coupled to the voltage source, and a drain coupled to the fourth node; and
a ninth PMOS transistor having a gate coupled to the third node, a source coupled to the voltage source, and a drain coupled to the fourth node;
wherein in the first latch unit, the gates of the seventh NMOS transistor and the sixth and eighth PMOS transistors receive the first latch clock signal;
wherein in the second latch unit, the gates of the seventh NMOS transistor and the sixth and eighth PMOS transistors receive the second latch clock signal;
wherein in the first latch unit, a first latched signal is generated at the third node, a second latched signal is generated at the fourth node, and the first and second latched signals constitute the first latched data; and
wherein in the second latch unit, a third latched signal is generated at the third node, a fourth latched signal is generated at the fourth node, and the third and fourth latched signals constitute the second latched data.

15. The analog-to-digital conversion device as claimed in claim 14, wherein the first and second latch clock signals are not simultaneously at a low level.

16. The analog-to-digital conversion device as claimed in claim 1 further comprises a track-and-hold unit for sampling a received data to generate the analog input data.

17. An analog-to-digital conversion device for digitizing an analog input data, comprising
- a first analog-to-digital (A/D) conversion stage for receiving the analog input data, wherein the first A/D conversion unit comprises:
  - a pre-amp unit for amplifying the analog input data and outputting a first amplified data;
  - a first latch unit enabled at a first time point for latching the first amplified data to generate a first latched data;
  - a second latch unit enabled at a second time point for latching the first amplified data to generate a second latched data, wherein the pre-amp unit is reset between the first and second time points, and
  - a first conversion unit for receiving the analog input data, the first latched data, and the second latched data and generating a first analog output data according to the analog input data, the first latched data, and the second latched data.

18. The analog-to-digital conversion device as claimed in claim 17, wherein the analog input data comprises an analog input signal, and the pre-amp unit comprises:
- an amplifier for receiving the analog input signal and a reference signal and amplifying the analog input signal to generate a first amplified signal, wherein the first amplified signal serve as the first amplified data; and
- a reset unit coupled to the amplifier;
- wherein between the first and second time points, the reset unit is enabled to reset a level of the first amplified signal.

19. The analog-to-digital conversion device as claimed in claim 17, wherein the analog input data comprises differential first and second analog input signals, and the pre-amp unit comprises:
- a first amplifier for receiving the first analog input signal and a first reference signal and amplifying the first analog input signal to generate a first amplified signal;
- a second amplifier for receiving the second analog input signal and a second reference signal and amplifying the second analog input signal to generate a second amplified signal, wherein the first and second amplified signals constitute the first amplified data; and
- a reset unit coupled to the first amplifier and the second amplifier;
- wherein between the first and second time points, the reset unit is enabled to reset levels of the first and second amplified signals.

20. An analog-to-digital (A/D) conversion stage comprising:
- a pre-amp unit for amplifying analog input data and outputting an amplified data;
- a first latch unit enabled by a first latch clock signal to latch the amplified data and generate a first latched data; and
- a second latch unit enabled by a second latch clock signal to latch the amplified data and generate a second latched data;
- wherein the pre-amp unit is reset between a time point when the first latch unit is enabled and a time point when the second latch unit is enabled.

21. The analog-to-digital conversion device as claimed in claim 20, wherein the analog input data comprises an analog input signal, and the pre-amp unit comprises:
- a comparator for receiving the analog input signal and a reference signal and generating a first amplified signal and a second amplified signal by comparing the analog input signal and the reference signal, wherein the first and second amplified signals serve as the amplified data;
- a reset unit coupled to the comparator; and
- a load unit coupled to the comparator and the reset unit;
- wherein the reset unit is enabled to reset levels of the first and second amplified signals between the time point when the first latch unit is enabled and the time point when the second latch unit is enabled.

22. The analog-to-digital conversion device as claimed in claim 20, wherein the analog input data comprises differential first and second analog input signals, and the pre-amp unit comprises:
- a first comparator for receiving the first analog input signal and a first reference signal and generating a first amplified signal and a second amplified signal according to the first analog input signal and the first reference signal;
- a second comparator for receiving the second analog input signal and a second reference signal and generating a third amplified signal and a fourth amplified signal according to the second analog input signal and the second reference signal, wherein a fifth amplified signal is generated according to a difference between the first and fourth amplified signals, a sixth amplified signal is generated according to a difference between the second and third amplified signals, and the fifth and sixth amplified signals serve as the amplified data;
- a reset unit coupled to the first comparator and the second comparator; and
- a load unit coupled to the first and second comparators and the reset unit;
- wherein the reset unit is enabled to reset levels of the fifth and sixth amplified signals between the time point when the first latch unit is enabled and the time point when the second latch unit is enabled.

23. The analog-to-digital conversion device as claimed in claim 20, wherein the analog input data comprises differential first and second analog input signals, and the pre-amp unit comprises:
- a first N-type metal oxide semiconductor (NMOS) transistor having a gate receiving the first analog input signal, a drain coupled to a first node, and a source;
- a second NMOS transistor having a gate receiving a first reference signal, a drain coupled to a second node, and a source coupled to the source of the first NMOS transistor;
- a first current source coupled between the source of the first NMOS transistor and a ground terminal;
- a third NMOS transistor having a gate receiving the second analog input signal, a drain coupled to the second node, and a source;
- a fourth NMOS transistor having a gate receiving a second reference signal, a drain coupled to the first node, and a source coupled to the source of the third NMOS transistor;
- a second current source coupled between the source of the third NMOS transistor and the ground terminal;
- a first PMOS transistor having a gate coupled to the first node, a source coupled to a voltage source, and a drain coupled to the first node;
- a second PMOS transistor having a gate coupled to the second node, a source coupled to the voltage source, and a drain coupled to the first node;
- a third PMOS transistor having a gate coupled to the second node, a source coupled to the voltage source, and a drain coupled to the second node;

a fourth PMOS transistor having a gate coupled to the first node, a source coupled to the voltage source, and a drain coupled to the second node; and a fifth PMOS transistor having a gate receiving a reset clock signal, a source coupled to the first node, and a drain coupled to the second node;

wherein a first amplified signal is generated at the first node, and a second amplified signal is generated at the second node; and wherein the first and second amplified signals constitute the amplified data.

\* \* \* \* \*